United States Patent [19]

Carlson et al.

[11] 3,991,227
[45] Nov. 9, 1976

[54] METHOD FOR FORMING ELECTRODE PATTERNS IN TRANSPARENT CONDUCTIVE COATINGS ON GLASS SUBSTRATES

[75] Inventors: David Emil Carlson, Yardley, Pa.; Lawrence Alan Goodman, East Windsor, N.J.

[73] Assignee: RCA Corporation, New York, N.Y.

[22] Filed: Jan. 27, 1975

[21] Appl. No.: 544,568

[52] U.S. Cl. .................. 427/39; 204/164; 427/109; 427/166; 427/203; 427/205; 427/259; 427/266
[51] Int. Cl.² .............................. B05D 3/06
[58] Field of Search ............ 427/38, 39, 43, 109, 427/166, 203, 205, 259, 266; 204/164

[56] References Cited
UNITED STATES PATENTS

| | | | |
|---|---|---|---|
| 2,501,563 | 3/1950 | Colbert et al. | 427/39 |
| 2,927,042 | 3/1960 | Hall et al. | 427/38 |
| 3,879,183 | 4/1975 | Carlson | 204/164 |

FOREIGN PATENTS OR APPLICATIONS

| | | | |
|---|---|---|---|
| 14,600 | 5/1970 | Japan | 427/39 |

OTHER PUBLICATIONS

Wallis et al. "Journal of Applied Physics" vol. 40 No. 10 Sept. 1969 pp. 3946–3949.

Primary Examiner—John H. Newsome
Attorney, Agent, or Firm—Glenn H. Bruestle; Birgit E. Morris; Carl L. Silverman

[57] ABSTRACT

A D.C. glow discharge is applied to a heated glass substrate coated with a conductive layer in the form of a pattern in an evacuated chamber, to which chamber certain amounts of oxygen and a volatile tin composition have been added. A glass substrate is produced which is coated with a patterned, transparent, conductive coating of tin oxide, wherein the surface region of the glass has been depleted of alkali metal ions.

7 Claims, 1 Drawing Figure

U.S. Patent  Nov. 9, 1976  3,991,227
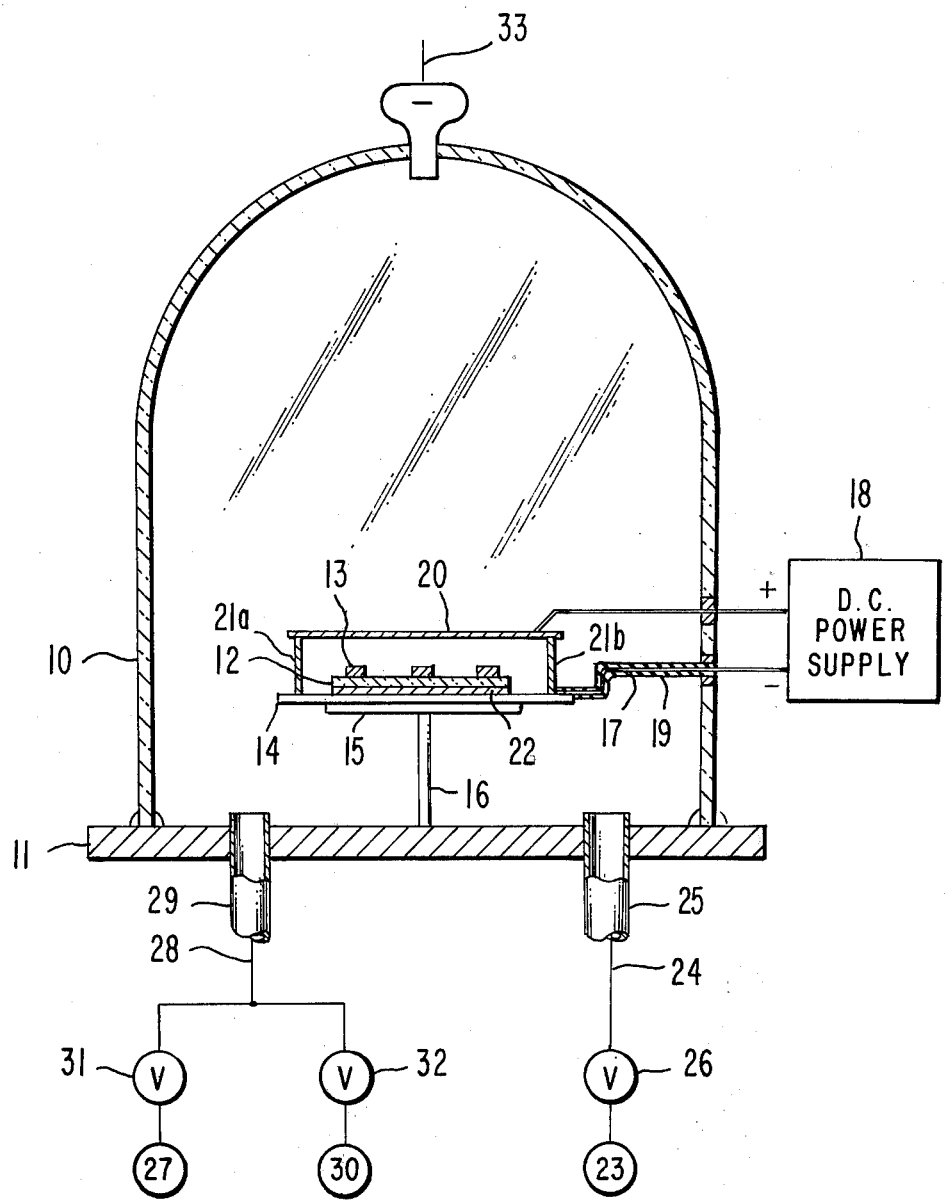

METHOD FOR FORMING ELECTRODE PATTERNS IN TRANSPARENT CONDUCTIVE COATINGS ON GLASS SUBSTRATES

This invention relates to a process for forming electrode patterns on glass substrates. More particularly, this invention relates to a method of applying conductive, transparent metal oxide films on glass substrates directly in the form of a desired pattern.

CROSS REFERENCES TO RELATED APPLICATIONS

This application discloses subject matter which is related to that of a copending application of D. E. Carlson and C. E. Tracy, "Deposition of Tin Oxide Films on Glass" filed concurrently herewith, Ser. No. 544,569, and to a copending application of Goodman et al., "Fabrication of Liquid Crystal Devices," Ser. No. 388,436, filed Aug. 15, 1973 now U.S. Pat. No. 3,879,183.

BACKGROUND OF THE INVENTION

Transparent, conductive, metal oxide films, such as tin oxide films, on glass substrates are useful for various applications. When employed as electrodes for liquid crystal cells, such films must be in the form of a pattern to allow for digital or other configurational readout. The films are patterned conventionally by first applying a thin, uniform film of the metal oxide onto the substrate and then removing part of the film to form the desired pattern. This can be done by applying a photoresist, exposing the photoresist to light through a photomask, developing the photoresist, thereby uncovering that portion of the metal oxide film to be removed, etching away the uncovered portions of the metal oxide film and finally removing the remaining photoresist. It is obvious that this is a tedious and expensive process, although it is sensitive and very detailed and highly resolved patterns can be made in this manner.

Another requirement for liquid crystal cell electrodes is that the glass substrate be of high quality and contain very few alkali metal ions. Alkali metal ions in the glass migrate to the surface of the electrode and are a cause of misalignment of the liquid crystal cells, which in turn causes hazy, low contrast areas in the cell. This would preclude the use of inexpensive soft or soda-lime-silicate glasses for use in liquid crystal cells were it not for the discovery that the surface of these glasses can be depleted of alkali metal ions by exposing the glass to a glow discharge, as disclosed in copending application of Goodman et al., referred to hereinabove. This treatment removes alkali metal ions to a depth of several thousand Angstroms. Conductive metal oxide films deposited on such ion-depleted glass substrates have improved uniformity and quality as well.

In copending application of Carlson et al., "Deposition of Tin Oxide Films on Glass" filed concurrently herewith, Ser. No. 544,569, a process is disclosed whereby a transparent, conductive tin oxide coating is deposited and, at the same time, the area beneath the coating is depleted of alkali metal ions. This process comprises applying a D.C. glow discharge to the heated glass substrate in a vacuum chamber to which small amounts of a volatile tin compound and oxygen have been added under certain conditions. High quality, uniform tin oxide films can be made in this manner.

However, for use in liquid crystal cells, it would be highly desirable to be able to apply the metal oxide film on the glass substrate directly in the form of a pattern, as by covering the glass substrate to be coated with a suitable mask. When conventional insulating masking materials are used, however, such as fused silica or aluminum oxide masks, a net surface charge on the surface is acquired during glow discharge which interferes with the deposition of the tin oxide, resulting in poor edge definition of the pattern. Further, the area of the substrate beneath the masked areas are not ion depleted during the glow discharge, with the result that such areas still contain alkali metal ions which can contribute to misalignment of liquid crystal cells made from them. Thus, an improved method was sought whereby a metal oxide film could be deposited directly in the form of a pattern and the glass substrate depleted of alkali metal ions uniformly throughout its surface area.

SUMMARY OF THE INVENTION

It has been found that transparent, conductive tin oxide films can be deposited in the form of a pattern onto a glass substrate, while ion depleting the substrate, using a conductive mask. A D.C. glow discharge is applied to the masked and heated glass substrate in an evacuated chamber containing small amounts of a volatile tin composition and oxygen. This process allows the direct deposition of patterned electrodes on large-area, ion-depleted glass substrates in a single step.

BRIEF DESCRIPTION OF THE DRAWING

The FIGURE is a schematic diagram of an apparatus useful for applying conductive metal oxide films on a substrate in the form of a pattern and concurrently ion depleting the surface of the substrate.

DETAILED DESCRIPTION OF THE INVENTION

According to the present process, high-quality tin oxide films can be applied to a glass substrate in the form of a pre-determined pattern by the process of: (a) applying a conductive masking material to the glass substrate as a negative of the desired pattern, (b) heating the coated glass substrate within the range of about 200°–450° C., but below the softening point of the glass, in an evacuated chamber, (c) adding suitable amounts of oxygen and a volatile tin compound to the chamber, (d) applying a D.C. glow discharge to the glass at a current density of from about 0.10 to about 0.55 mA/cm$^2$ for a period of about 15 seconds to about 3 minutes to form a high-quality, transparent, conductive, tin oxide coating on the glass substrate not covered by the conductive material, and (e) removing the masking material. The glass substrate is concurrently depleted of alkali metal ions throughout the surface of the glass covered by the patterned tin oxide coating.

The conductive masking material must be able to be readily applied to the glass in the desired configuration, as by painting, screen printing and the like, and must be readily removable after deposition of the tin oxide coating. During the tin oxide deposition, the masking material will acquire a potential similar to the conductive tin oxide film being applied. Thus, the glass substrate beneath both the tin oxide film and the masking material will be ion depleted and the edge definition of the tin oxide film being applied will remain sharp and true.

Materials suitable as masking materials are finely divided conductive particles slurried in a readily-evaporatable carrier liquid, which can be water or an organic solvent. Suitable conductive particles can be of a conductive metal, such as copper, nickel, gold and the like, or can be of graphite. Preferably the particles will be about 10 microns in size or less. The slurry or suspension is applied to the substrate in the desired pattern and dried to evaporate the carrier liquid.

Referring now to the FIGURE, the reactions are carried out in a vacuum chamber 10 which is sealed to a baseplate 11. The glass substrate to be coated, 12, having a patterned thin layer of a conductive masking material 13 thereon, is mounted on an insulating platform 14, heated by a heater 15. The heater 15 is supported by a fused silica pedestal 16. The substrate 12 also acts as the cathode during glow discharge and is connected to the negative lead 17, of a high-voltage D.C. power supply 18, capable of supplying a current density of about 0.5 mA/cm$^2$ and having a voltage rating of about 1 kV. The negative lead 17 is suitably a thin platinum wire which is shielded with a fused silica tubing 19 in those portions not in contact with the substrate 12. A metal sheet 20 which acts as the anode during glow discharge, is connected to the positive lead of the power supply 18 and is positioned parallel to and about 2 cm above the glass substrate 12, by means of ceramic spacers 21a and 21b. The metal sheet 20 is preferably perforated and can be a conductive metal grid or screen, as of steel, aluminum, platinum and the like. Substrate 12 is coated on the side away from the anode 20 with a conductive coating 22, as of silver or graphite, so the current is passed through the glass substrate 12 during glow discharge. By applying a high voltage to the electrodes 12 and 20, a glow discharge is produced between them.

The vacuum chamber 10 can be evacuated by an evacuating pump 23 connected by means of an exit line 24 through an exit port 25 of the baseplate 11 and is monitored by a valve 26.

A storage unit 27 for the volatile tin compound is connected to the vacuum chamber 10 by means of a feed line 28 to the inlet port 29 through the baseplate 11. A storage unit 30 for oxygen is also connected to the feed line 28. The relative amounts of the volatile tin compound and oxygen fed to the vacuum chamber 10 is monitored by valves 31 and 32, respectively. In the case where dopant gases are also fed to the vacuum chamber 10, they can be connected to the feed line 18 in like manner. The pressure inside the vacuum chamber 10 is monitored by means of a gauge 33, which can be a thermocouple vacuum gauge or a McLeod gauge.

It will be understood that various modifications of the above-described apparatus can be made. In the event the vacuum chamber 10 can be mounted in a furnace, the heater 15 is unnecessary. In that event, the glass substrate 12, when properly mounted and shielded, can be contacted by glow discharge on both sides, the patterned surface being coated with tin oxide and ion depleted.

In using the above apparatus to deposit tin oxide films, the vacuum chamber 10 is first evacuated by means of the pump 23 to its ultimate pressure while heating the glass substrate 12 to the desired temperature with the heater 15. Suitable temperatures can be from about 200° C. up to the softening temperature of the glass, but preferably are below about 400° C. When an organic volatile tin compound, such as tetramethyl tin, is employed in the present process, lower temperatures can be employed than is required for a chemical vapor deposition process, because the glow discharge dissociates the molecules and drives the positive tin ions to the surface of the cathode 12 under high energy. However, as the temperature of deposition increases, the tin oxide films become more durable. The valve 26 connected to the vacuum pump 23 is then shut off and the volatile tin compound is bled into the vacuum chamber 10 by means of the valve 31 through the feed line 28 up to the desired pressure as measured by the gauge 33. The desired amount of oxygen is then added by means of the valve 32, also through the feed line 28. The final vapor pressure in the vacuum chamber 10 is suitably from about 0.5 to about 2.0 torr, preferably below about 1.0 torr.

The ratio by volume of oxygen and the tin composition employed can vary widely and is dependent upon the nature of the tin compound employed, the presence or absence of dopants, the substrate temperature and the like. In general, a volume ratio of from about 15:1 to about 1:1 can be employed. The optimum ratio for particular tin compositions and reaction conditions can readily be determined by one skilled in the art by a series of test runs. As illustrations, when tetramethyl tin is employed and the substrate temperature is about 400° C., a volume ratio of from about 15:1 to about 5:1 of oxygen to the tin composition is suitable; however, ratios by volume between about 9:1 to about 6:1 are preferred for highly conductive films; when tin tetrachloride is employed as the tin compound, a volume ratio of from about 4:1 to about 1:1 of oxygen to tin compound is preferred. In general, if the amount of tin compound added is increased above an optimum amount, the deposited films increase in thickness and volume resistivity and become yellow in color.

The current is then turned on. A current density between about 0.10 to about 0.55 mA/cm$^2$ should be maintained. The current density in general is directly proportional to the rate of deposition of the tin oxide film. Excellent films about 1000 Angstroms thick can be deposited in about 1 minute when the current density is about 0.5 mA/cm$^2$ in a pressure of about 1 torr. If the current density is too low, the resistivity of the resultant film is high. However, if the current density is too high, a rapid increase in surface resistivity occurs also, probably due to increased sputtering which causes a decrease in film thickness, and which in turn ultimately results in removal of the tin oxide film.

The minimum voltage for deposition can be determined by adjusting the applied voltage so that the glow of the discharge just covers the entire surface of the substrate to be coated. Operation near the minimum voltage assures uniform tin oxide deposition while minimizing sputtering effects. The applied voltage may be increased during deposition if required. In the case where high alkali-containing glasses are employed as substrates, as the surface being coated becomes ion depleted, its resistance also increases and a higher applied voltage may be required for continued deposition.

The current is maintained for from about 15 seconds to about 3 minutes, depending on the amount of current, to deposit films of the proper thickness, generally from about 700 to 1500 Angstroms. When the proper film thickness is obtained, the glow will be extinguished.

As is known, the addition of minimum amounts of antimony as a dopant for tin oxide coatings decreases the resistivity of the films. Thus, if desired, a small amount of a volatile antimony compound, such as antimony pentachloride, can be added to the vacuum chamber as a portion of the volatile tin composition. Although the exact amount of antimony present is not critical, a ratio by volume of at least about 10% of the antimony compound to the tin compound is desirable in order to achieve a substantial decrease in resistivity of the resultant film.

By adjustment of tin to oxygen ratios, substrate temperature, current density and deposition time, excellent patterned tin oxide films about 1000 Angstroms thick, having a high transmission, on the order of 85% or higher, and low resistivity, on the order of 200–500 ohms/square, can be readily achieved using the present process, while at the same time the surface region beneath the coated and uncoated areas for about 1000 Angstroms or more in depth is substantially depleted of alkali metal ions. The resultant films have good thermal stability. The resistivity of tin oxide films produced according to the present process increases only about 10–20% after baking at 400° C. in air for 24 hours.

The invention will be further illustrated by the following Examples but it is to be understood that the invention is not meant to be limited to the details described therein.

EXAMPLE 1

In a vacuum chamber as in the FIGURE, a soda-lime-silicate glass plate having a glass composition of about 73% $SiO_2$, 13.5% $Na_2O$, 9% CaO, 4% MgO and 0.2% $Al_2O_3$, all percents by weight, was painted with a letter R, using a slurry of 2–3 micron-size nickel particles in a binder of amyl acetate and nitrocellulose. The back of the glass plate was coated with a graphite slurry available as Aquadag, a trademark of Acheson Colloids Co. The coated plate was mounted as the cathode and a perforated cold rolled steel plate about 2 cm above and parallel to the plate was mounted as the anode. The vacuum chamber was evacuated to a pressure of about 10 microns of air while heating the glass plate to a temperature of about 400° C. Antimony pentachloride vapor was added to the chamber to a pressure of about 0.04 torr, then tin tetrachloride vapor was added to the chamber to a pressure of 0.15 torr and oxygen was added to a pressure of about 1 torr.

A voltage of 700 volts was applied such that about 400 volts was passed across the gap between the anode and the cathode and about 300 volts passed across a $10^5$ ohm limiting resistor, to prevent arcing. The current density was maintained at a constant level of 0.18 $mA/cm^2$ for a deposition time of 2 minutes.

A film of antimony-doped tin oxide was applied to the glass plate, while at the same time the surface layer of the glass was ion depleted to a depth of about 2100 Angstroms. The antimony-doped tin oxide film had a thickness of about 700 Angstroms, and an average transmission of visible light of about 90%, compared to a sample of uncoated glass as a control. The surface resistivity was about 700 ohms/square and the bulk resistivity was about $4.9 \times 10^{-3}$ ohm-cm.

The nickel powder was removed from the plate by wiping with acetone. The surface resistivity of the region within the letter R was measured to be over $10^9$ ohms/square.

EXAMPLE 2

A glass plate as in Example 1 was masked with scotch tape except for a small portion of the glass. The unmasked portion was sprayed with Aerodag G, available from Acheson Colloids Co., which is colloidal (about 1 micron in size) graphite suspended in isopropyl alcohol. After removing the masking tape, the sample was heated in air to 350° C. for 10 minutes to burn off the organic material in the Aerodag G. After cooling, the back of the glass plate was coated with Aquadag and the glass plate charged to a vacuum chamber as in Example 1, and heated to a temperature of 400° C. The resultant antimony-doped tin oxide film was about 800 Angstroms thick, the average transmission was about 85%, and the surface resistivity was about 230 ohms/square.

The Aerodag G was removed by wiping the coated plate with acetone. The edge resolution of a mask region was on the order of a few microns. The surface resistivity in the masked area was about $10^8$ ohms/square.

We claim:
1. A method of depositing transparent, conductive, patterned films of tin oxide on a glass substrate which comprises:
   a. applying a conductive masking material in the desired pattern to the glass substrate,
   b. heating said glass substrate to a temperature in the range of from about 200° C. to below the softening temperature of the glass in an evacuated chamber,
   c. adding to said chamber oxygen and a volatile tin composition to a partial pressure up to about 2.0 torr so that the volume ratio of the vapors is from about 15:1 to about 1:1 of oxygen to the tin composition,
   d. applying a D.C. glow discharge between two electrodes situate in said chamber, the cathode of which is said glass substrate, at a current density of from about 0.10 to about 0.55 $mA/cm^2$ for a period of about 15 seconds to about 3 minutes, so that the unmasked portion of said glass substrate becomes simultaneously coated with a tin oxide film and the surface region beneath the coating and masking material becomes depleted of alkali metal ions, and
   e. removing said conductive masking material.
2. A method according to claim 1 wherein the glass is a soda-lime silicate glass.
3. A method according to claim 1 wherein said conductive masking material comprises finely-divided particles of nickel.
4. A method according to claim 1 wherein said conductive masking material comprises finely-divided graphite particles.
5. A method according to claim 1 wherein the tin composition contains tetramethyl tin and the ratio by volume of oxygen to the tin composition is from about 9:1 to about 6:1.
6. A method according to claim 1 wherein the volatile tin composition contains tin tetrachloride and the ratio by volume of oxygen to the tin composition is from about 4:1 to about 1:1.
7. A method according to claim 3 wherein the volatile tin composition contains antimony pentachloride.

* * * * *